July 24, 1962 R. A. KAENEL 3,046,543

ANALOG-TO-DIGITAL CONVERTER

Filed Nov. 27, 1959 2 Sheets-Sheet 1

INVENTOR
R. A. KAENEL
BY R. B. Anderson
ATTORNEY

July 24, 1962 R. A. KAENEL 3,046,543

ANALOG-TO-DIGITAL CONVERTER

Filed Nov. 27, 1959 2 Sheets-Sheet 2

INVENTOR
R. A. KAENEL
BY R. B. Ardis
ATTORNEY

United States Patent Office 3,046,543 Patented July 24, 1962

3,046,543
ANALOG-TO-DIGITAL CONVERTER

Reginald A. Kaenel, Murray Hill, N.J., assignor to Bell Telephone Laboratories, Incorporated, New York, N.Y., a corporation of New York Filed Nov. 27, 1959, Ser. No. 855,819
6 Claims. (Cl. 340—347)

This invention relates to data conversion systems, and more particularly to analog-to-digital converters utilizing feedback techniques to generate a digital output signal in accordance with an analog input signal.

Devices, commonly known as analog-to-digital converters, are frequently used in the field of data processing to transform an analog signal bearing information in the form of amplitude into a coded group of bivalued steps, the code of the latter corresponding to the amplitude of the former. One particularly advantageous arrangement of equipments capable of performing the above-described function is the "feedback encoder" type analog-to-digital converter. Basically, a feedback encoder utilizes a threshold device to compare the amplitude of the analog signal with the amplitude of a controllable reference level and produces, in accordance with the result of the comparison, a variable control pulse which is fed back to the reference level generator to cause the amplitude of the reference level to approach as closely as possible that of the analog signal. The reference level generator usually includes a plurality of bistable devices, the combination of states of conduction of which determinates the amplitude of the reference level. By sensing the particular combination of states in which the bistable devices reside as a result of the feedback operation, a digital representation of the amplitude of the analog signal is obtained. Encoding by use of feedback techniques is well known in the data conversion art, and devices performing this function are described, for example, in the article entitled "Coding by Feedback Methods" by B. D. Smith, published at page 1053 of the August 1953 issue of the Proceedings of the Institute of Radio Engineers.

Frequently, due to requirements of the data processing system of which a feedback encoder may be a component, the bistable devices included in the reference level gentrator operate sequentially in response to the coincidence of both the control pulse and a series of timing pulses, each timing pulse having a finite duration. Although "feedback encoders" characterized by this arrangement generally maintain reasonable accuracy, undesirable errors nevertheless do arise under certain circumstances. For example, in feedback encoders responsive to the coincidence of both a timing and a control pulse, no bistable device should be induced to change its state of conduction more than once in the duration of any timing pulse. Any bistable device which is so induced may be residing in a false state of conduction, and thus becomes a possible source of error. If there is insufficient delay around the feedback loop (i.e. the time duration between the leading edge of a particular timing pulse and the occurrence of a change in the control pulse generated in response to that particular timing pulse is less than the duration of a timing pulse) a condition is established wherein it becomes possible for any of the bistable devices to be induced to change state more than once per timing pulse. In other words, with an insufficient delay in the feedback loop a change in the characteristic of the control pulse in response to a particular timing pulse will induce a bistable device to change its state of conduction during the occurrence of the particular timing pulse which induced the change and not during the occurrence of the succeeding timing pulse when the change of state should occur. Since the output step of each bistable device represents one digit in the total digital representation of the analog signal, it is apparent that if a bistable device representing a higher order digit resides in a false state of conduction, considerable error will result.

While adding delay to the feedback loop of a feedback encoder tends to prevent errors of the type described above, such delay may in certain instances cause an intolerable decrease in the speed at which the analog-to-digital conversion can be accomplished. As an illustration, assume that the active elements of the reference level generator are inexpensive, low tolerance transistors, having the concomitant asymmetrical transition characteristics of relatively large storage delay when rendered nonconducting from the saturation region, and substantially instantaneous conduction when rendered conducting. If upon the coincidence of a timing and a control pulse the transistor to which the coincident signals are applied is nonconducting, and the characteristic of the control pulse is such as to induce conduction, the transistor will be energized substantially instantaneously. If, however, upon application of the coincident signals the transistor is to be rendered nonconducting from a state of saturation, an appreciable amount of time (i.e. the storage delay time) must occur before the transistor responds. This interval of time between the occurrence of the coincident pulses and the response of the saturated transistor constitutes delay in the feedback loop, or, stated differently, the time duration between the occurrence of a particular timing pulse and the occurrence of a change in the control pulse generated in response to that particular timing pulse is increased by the response time of the transistor. Since the time interval between successive timing pulses must be large enough to allow a change in the control pulse initiated in response to any particular timing pulse to reach the reference level generator through the feedback path either coincidentally with, or at some instant of time before, the occurrence of the succeeding timing pulse, and since the speed at which conversion is accomplished is determined by the frequency at which the timing pulses occur, it follows that the larger the total delay around the feedback loop, the slower will be the speed of conversion. Thus, if a delay element is introduced into the feedback loop to reduce substantial errors resulting from insufficient delay, the speed at which the analog-to-digital conversion can be accomplished is reduced. Any reduction in the speed of conversion, or more particularly any reduction in the clock pulse frequency, is especially undesirable since, according to the Nyquist criterion, this frequency is one factor which determines the bandwith of the analog information capable of being operated upon by the data processing system of which the converter is a component.

Accordingly, it is an object of this invention to reduce errors accompanying the analog-to-digital conversion process of a code converter which utilizes feedback techniques.

It is another object of this invention to reduce errors in the output of an analog-to-digital converter of the feedback encoder type while not reducing the speed at which conversion can be accomplished.

It is a further object of this invention to allow low tolerance transistors having relatively large storage delay to be utilized in an analog-to-digital converter without a reduction in the speed at which conversion can be accomplished.

It is a still further object of this invention to maintain undiminished the speed and accuracy of an analog-to-digital converter utilizing low tolerance, large storage delay transistors without the necessity of additional circuitry operable to prevent the transistors from entering the saturation region.

According to the invention in one of its principal aspects, an analog signal is sequentially compared to an adjustable reference level, the combination of components of which comprise a digital signal, in a device which produces control pulses the characteristic of which varies in accordance with the comparison; these control pulses are fed back to adjust the reference level so as to have it approximate the analog signal; and a variable delay element is introduced into the feedback path to delay the control pulses in accordance with the previously-mentioned characteristic.

One important feature of the invention includes a variable delay device inserted in the feedback path of a feedback encoder type analog-to-digital converter to delay a control pulse in accordance with a particular characteristic of that pulse. In one embodiment of this feature, the variable delay device includes an artificial delay network having two input and two output terminals, and a diode essentially connected between one of the input and one of the output terminals. If a pulse characterized by a polarity which will forward bias the diode is applied to the input terminals of the artificial delay network, the diode will effectively become a short circuit and immediately present the applied pulse to the output of the network. If, on the other hand, a pulse, characterized by a polarity which will back bias the diode, is applied to the input terminals, the diode will appear as an open circuit and the pulse will not appear at the output terminals until a time interval has elapsed corresponding to the delay time of the artificial network.

The foregoing and other objects and features of the invention will be more fully understood by reference to the following description of one embodiment of the invention and the attached drawings of which:

Figure 1:
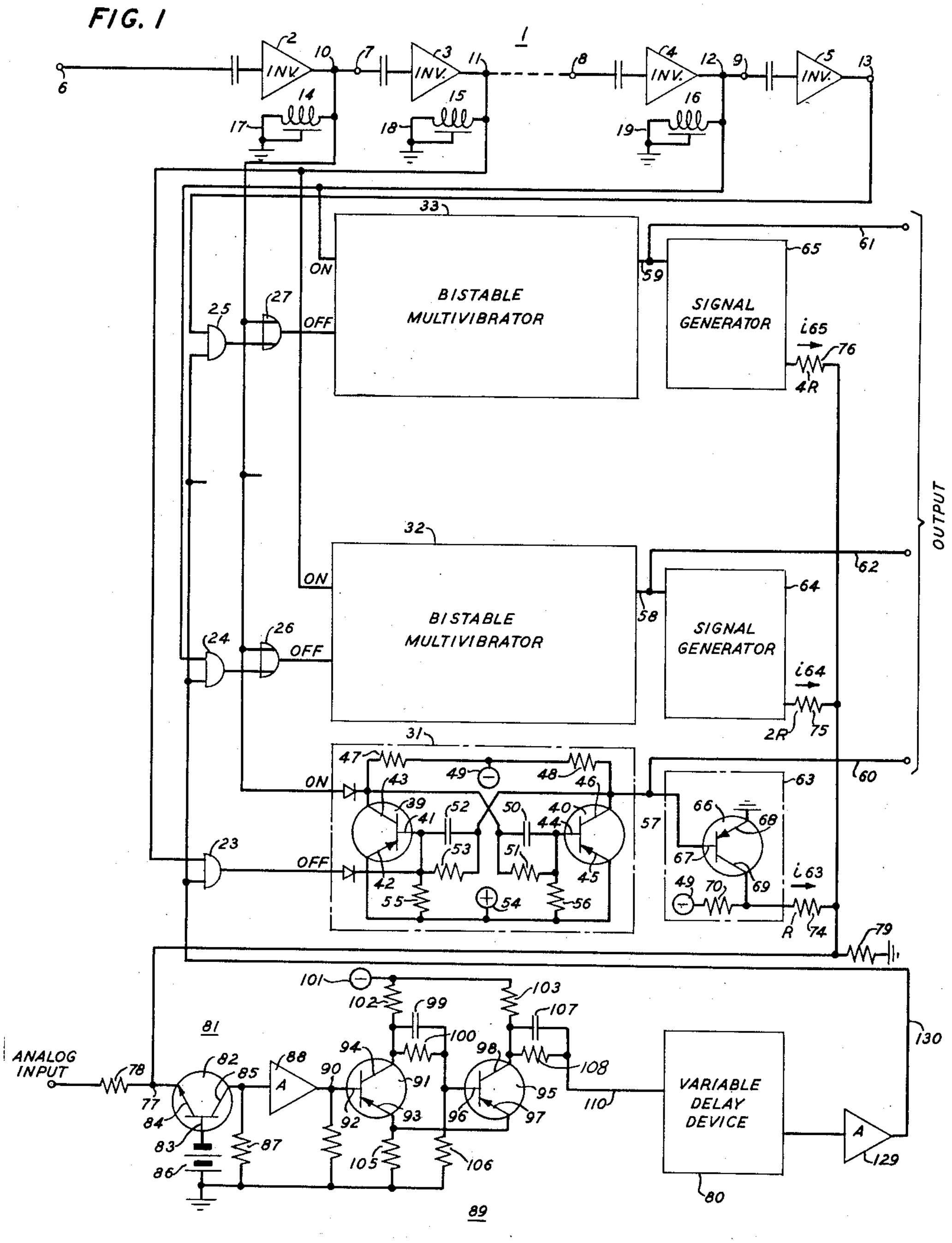
FIG. 1 shows one illustrative embodiment of the invention.

With reference to FIG. 1 of the drawings a timing generator 1 for producing a sequence of equally spaced pulses in response to one starting pulse is shown comprising serially connected inverting amplifiers 2, 3, 4, and 5, having, respectively, input terminals 6, 7, 8, and 9, and output terminals 10, 11, 12, and 13. Inverters 2, 3, 4, and 5, are biased such that upon the application of a negative going signal to an input terminal, a positive going signal results at an output terminal, while upon application of a positive going signal to an input terminal, no change in signal level appears at an output terminal. One such inverting amplifier, for example, includes as its active element a transistor of the PNP conductivity type having an input terminal connected to the base electrode and an output terminal connected to the collector electrode, and which, by suitably positioned resistors and potential sources, is biased to cutoff. Connected to the respective output terminals of inverting amplifiers 2, 3, and 4, are delay lines 14, 15, and 16, which are, for example, four-terminal artificial transmission line networks terminated at their respective reflecting ends by short circuit connections 17, 18 and 19. Each delay line is constructed so that the time interval necessary for an electrical signal to propagate from the input terminals to the reflecting terminals is one-half of the desired time interval between successive timing pulses produced by timing generator 1. While only four inverting amplifiers and three delay lines are shown in timing generator 1, it is to be understood that the number of inverters and delay lines may be either increased or decreased depending upon the number of timing pulses to be generated in any pulse sequence.

Connected to terminals 11, 12, and 13, are the first of two input terminals of coincidence circuits 23, 24, and 25, respectively. A coincidence circuit, sometimes called an AND gate, of the type represented by 23, 24, or 25, has a plurality of input terminals and a single output terminal, and is operable to present a signal of a particular polarity to its output terminal when signals of that same polarity coincidently appear at all of its input terminals. Circuit arrangements which perform the above-described function are well known in the art, one example being illustrated in FIG. 13—8 on page 398 of "Pulse and Digital Circuits" by Millman and Taub published in 1956 by the McGraw-Hill Book Company, Inc. The output terminals of coincidence circuits 24 and 25, respectively, are connected to the first input terminals of OR circuits 26 and 27. An OR circuit of the type represented by 26 or 27 has a plurality of input terminals and one output terminal, and is operable to present a signal of a particular polarity to its output terminal when a signal of that same polarity appears on any of its input terminals. Arrangements of OR circuits performing the functions described above are well known, one example being illustrated in FIG. 13—3 on page 394 of "Pulse and Digital Circuits." The second input terminals of OR circuits 26 and 27 are connected to output terminal 10 of amplifier 2.

Connected to the output terminals of coincidence circuit 23, OR circuit 26, and OR circuit 27, are the OFF terminals of bistable multivibrators 31, 32, and 33, respectively. The ON terminals of multivibrators 31, 32, and 33, respectively, are connected to the output terminals of amplifiers 2, 3, and 4. Multivibrators 32 and 33 are similar to that shown at 31, and include, for example, transistors 39 and 40 of the PNP conductivity type, respectively having base electrodes 41 and 44, emitter electrodes 42 and 45, and collector electrodes 43 and 46. Connected to collector electrodes 43 and 46 of transistors 39 and 40 through resistors 47 and 48, respectively, is negative potential source 49. Cross-coupling the collector electrode 43 of transistor 39 to the base electrode 44 of transistor 40 is a combination of elements comprising coupling capacitor 50 connected in parallel with resistor 51, and likewise, cross-coupling the collector electrode 46 of transistor 40 to the base electrode 41 of transistor 39 is a similar parallel combination comprising coupling capacitor 52 and resistor 53. A positive source of potential 54 is directly connected to emitter electrodes 42 and 45, and is connected to base electrodes 41 and 44 through resistors 55 and 56, respectively. As shown in FIG. 1, the ON and OFF terminals of multivibrator 31 are connected, respectively, to base 44 of transistor 40 through capacitor 50, and to base 41 of transistor 39. The ON and OFF terminals of multivibrators 32 and 33 are connected to corresponding elements of their respective circuits. Signals from transistor 40 are utilized as the output of multivibrator 31 and are detected by conductor 57 which is connected to the circuit at collector electrode 46. Conductors 58 and 59 of multivibrators 32 and 33, respectively, correspond to conductor 57 of multivibrator 31, and are, therefore, connected to corresponding elements of those circuits. It is to be understood that the particular configuration of multivibrator 31 is only one of a number of circuit arrangements which may be advantageously utilized in the invention and is in no way intended to limit its scope.

Conductors 57, 58, and 59, are connected, respectively to digital output terminals 60, 61, and 62, and to signal generators 63, 64 and 65. Signal generators 64 and 65 are similar to that shown at 63 and include, for example, switching transistor 66 of the PNP conductivity type having base electrode 67, emitter electrode 68, and collector electrode 69. Collector electrode 69 is coupled to negative potential source 49 through resistor 70, and emitter electrode 68 is connected to a suitable source of potential such as ground. An input path is made available to signal generator 63 by connecting conductor 57 to base electrode 67, and input paths are similarly included in signal generators 64 and 65, respectively, through conductors 58 and 59. Many circuit arrangements functionally equivalent to signal generators 63, 64, and 65, are available in the prior art, and the particular configuration shown at 63 of FIG. 1 should in no way restrict the scope of the invention.

Connecting collector electrode 69 of transistor 66, and the corresponding elements of signal generators 64 and 65, respectively, to junction 77 are summing resistors 74, 75, and 76, having resistances R, 2R, and 4R, in that order. The particular relative weighing of resistors 74, 75, and 76, as stated above, is by way of example only, any one of a number of ratios being satisfactory provided that the order of relative magnitudes is maintained the same. The analog input signal to be represented digitally is applied to ground through a voltage divider comprising serially connected resistors 78 and 79, the junction between resistors 78 and 79 being connected to junction 77. Junction 77 is also connected to the emitter electrode 84 of a low-input impedance summing amplifier 81. The summing amplifier shown at 81, an arrangement to which the invention is in no way restricted, includes for example, a transistor 82 of the NPN conductivity type having a base electrode 83 connected to ground through a negative source of potential 86, an emitter electrode 84, and a collector electrode 85 connected to ground through resistor 87. The output of summing amplifier 81, appearing at collector 85, is coupled to linear amplifier 88 and applied to the input terminal 90 of the Schmitt, or cathode coupuled, threshold circuit shown generally at 89. Schmitt circuits are well known to those skilled in the art and a rigorous analysis of the vacuum tube analogy of the transistor circuit pictured at 89 is found in Sec. 5–10 beginning at page 164 of the previously-referred to reference "Pulse and Digital Circuits." Threshold circuit 89 comprises transistors 91 and 95 of the PNP conductivity type having, respectively, base electrodes 92 and 96, emitter electrodes 93 and 97, and collector electrodes 94 and 98. Preferably, transistors 91 and 95 are fast acting with small storage delay times. Cross-coupling the collector electrode 94 of transistor 91 to base electrode 96 of transistor 95 is the combination comprising coupling capacitor 99 connected in parallel with resistor 100, and respectively connecting the collectors 94 and 98 of transistors 91 and 95 to source of negative potential 101 are resistors 102 and 103. Emitters 93 and 97, respectively, of transistors 91 and 95 are connected together and returned to a suitable source of potential, such as ground, through resistors 105, and base 96 of transistor 95 is returned to a suitable source of potential, such as ground, through resistor 106.

Figure 3:
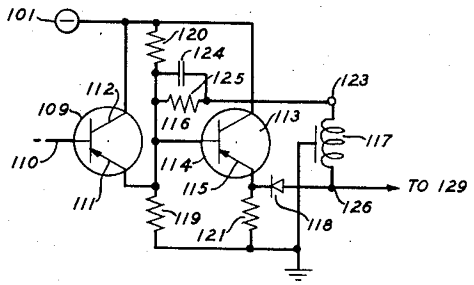
FIG. 3 shows one illustrative embodiment of a variable delay device which may be advantageously utilized in the invention.

Connected to collector electrode 98 of transistor 95 by the parallel combination comprising coupling capacitor 107 and resistor 108, is variable delay circuit 80. According to the invention, the function of this circuit, one embodiment of which is shown in detail in FIG. 3, is to delay the translation of applied pulses for intervals of time determined by the characteristics of those applied pulses. Pulses emanating from the output side of variable delay device 80 are amplified by linear amplifier 129, and returned, through conductor 130, to the second input terminals of coincidence circuits 23, 24, and 25.

Illustrated in FIG. 3 is one embodiment of the variable delay device 80 shown generally in FIG. 1. As shown in FIG. 3, the variable delay device comprises transistors 109 and 113, both illustrated as being of the PNP conductivity type, delay line 117, and diode 118. Transistor 109, having base electrode 110, emitter electrode 111, and collector electrode 112, is arranged in the emitter follower configuration with the base electrode 110, serving an input terminal, connected to the remaining junction of the parallel combination of coupling capacitor 107 and resistor 108, the emitter electrode 111 returned to both a suitable source of potential, such as ground, through resistor 119 and returned to source 101 through resistor 120, and collector electrode 112 directly returned to source 101. Transistor 113, having base electrode 114, emitter electrode 115, and collector electrode 116, is also arranged in the emitter follower configuration with its base electrode 114 connected to the junction between resistors 119 and 120, its emitter electrode 115 returned to a suitable source of potential, such as ground, through resistor 121, and its collector electrode 116 directly returned to source 101. Both transistors 109 and 113 are biased as Class A amplifiers, or, in other words, always reside in their linear region of operation. Connected by the parallel combination of resistor 125 and capacitor 124 to the junction between resistors 119 and 120 through its input terminal 123 is delay network 117, which comprises any of a number of devices operable to delay for a predetermined period of time the transmission of signals from a pair of input terminals including terminal 123 to a pair of output terminals including terminal 126. To prevent reflections, as will subsequently be explained, resistor 125 is made substantially equal in value to the characteristic impedance of delay network 117. In accordance with the teaching of the present invention, the delay time of network 117, i.e., the time interval necessary for a signal appearing at input terminal 123 to propagate in network 117 to output terminal 126, is greater than the time duration of any clock pulse generated by clock pulse generator 1, but less than the time duration between successive clock pulses in any sequence of pulses. Connected between output terminal 126 of delay network 117 and emitter electrode 115 of transistor 113 is a unidirectional signal translating device, illustrated in the drawing as diode 118. In accordance with the present invention, this diode is poled so that it presents substantially a short circuit path to pulses which appear at emitter electrode 115 of transistor 113 as a result of the sum of the components of the reference level from signal generators 63, 64, and 65, being less than the value of the analog input signal. Conversely, the diode presents substantially an open circuit path to pulses appearing at emitter electrode 115 as a result of the sum of the components of the reference level from signal generators 63, 64, and 65, being greater than the analog input signal. It is to be understood that the variable delay device as illustrated in FIG. 3 is but one of a number of such devices capable of performing the function described in the preceding paragraph, and its inclusion in the specification is in no way intended to restrict the invention to that particular embodiment.

Figure 2:
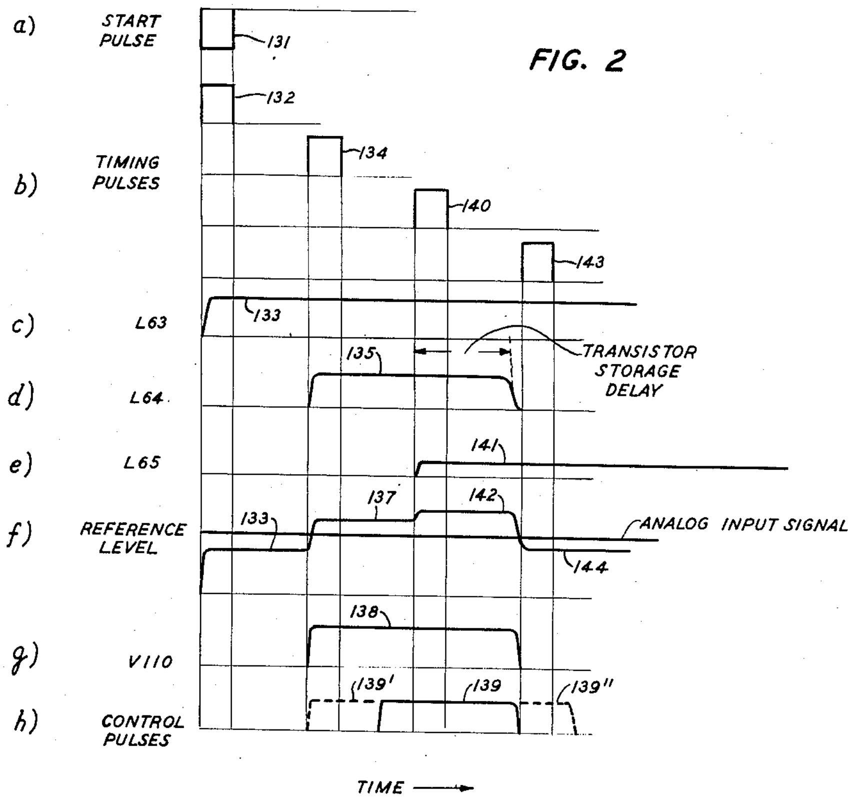
FIG. 2 illustrates several waveforms appearing at various points in the circuit which are useful in explaining the invention.

As an aid to a better understanding of the embodiment of the invention illustrated in FIG. 1, reference will be made to the waveforms of FIG. 2. To initiate the digital-to-analog conversion process start pulse 131 of waveform *a* which, for example, has a width of 0.2 $\mu$s., is applied to input terminal 6 of inverting amplifier 2. This pulse, as part of the first step in the conversion process, is substantially instantaneously translated to output terminal 10, and in its inverted form, as timing pulse 132 of waveform *b*, applied simultaneously to delay line 14, input terminal 7 of inverting amplifier 3, an input terminal of OR circuits 26 and 27, and the ON terminal of multivibrator 31. For purposes of definition a multivibrator, such as that shown at 31, is defined as being ON when transistors 39 and 40 are conducting and nonconducting, respectively, and OFF when those transistors are, respectively, in opposite states of conduction. Also, a signal generator, such as that shown at 63, is defined as being ON when its transistor 66 is conducting, and OFF when its transistor is nonconducting. Pulse 132 in being applied directly to the ON terminal of multivibrator 31, is coupled through capacitor 50 to base 44 of transistor 40. A positive pulse so applied renders transistor 40 nonconducting, causing a negative signal to appear at collector 46 which is coupled through capacitor 52 to base 41 of transistor 39 rendering that transistor conducting. Thus, multivibrator 31 is placed in the ON condition. Similarly, pulse 132 in being applied through OR circuits 26 and 27 to the OFF terminals of multivibrators 32 and 33, respectively, renders those devices in the OFF condition.

The negative signal appearing at collector 46 is coupled to base 67 of transistor 66 through conductor 57 and places signal generator 63 in the ON condition. Similarly, the positive signals appearing on conductors 58 and 59, due to multivibrators 32 and 33 being in the OFF condition, place signal generators 64 and 65 in the OFF condition. Assuming, initially, a quiescent condition in which there is no analog input signal, and signal generators 63, 64, and 65, are all in the OFF condition, quiescent current emanating from ground flows through resistors 74, 75, and 76, to negative sources of potential, corresponding to 49 of signal generator 63, through the serially-connected path comprising resistor 87 and the collector-to-emitter path of transistor 82, and also through the path comprising resistor 79. This quiescent current represents the zero value of the reference level, and its components in each of the resistors 74, 75, and 76, have magnitudes represented by the base lines of waveforms *c*, *d*, and *e*.

When transistor 66 of signal generator 63 is rendered conducting, collector 69 assumes ground potential. Since junction 77 is maintained at the negative potential of the base of transistor 82 by virtue of the emitter follower configuration of summing amplifier 81, the current flowing in resistor 74 changes in value by a magnitude represented in waveform *c* as step 133. It will be noted that this current arises substantially instantaneously owing to the fact that the time necessary to energize a nonconducting transistor is relatively insignificant. If the analog signal applied to the analog input terminal is of such a polarity to accept current flowing toward it, figuratively speaking, and is of a magnitude compared to current step 133 as shown in waveform *f*, the current emanating from emitter 84 of transistor 82 increases. This increase, due to the tendency of a transistor connected in the emitter follower configuration to maintain its emitter voltage the same as its base voltage, is substantially equal to the difference between current step 133 and the analog signal.

The change in current through transistor 82 manifests itself at collector 85 as a negative going signal which is amplified by amplifier 88 and applied to terminal 90 of threshold circuit 89. The parameters of summing amplifier 81 are chosen so that the current flowing through resistor 87, during quiescent conditions creates a voltage at collector 85, and consequently at terminal 90, which while maintaining transistors 91 and 95 conducting and nonconducting, respectively, nevertheless approximately equals the threshold voltage of circuit 89. Thus, the negative going signal applied to base 92 of transistor 91 induces no shift in the state of conduction of threshold circuit 89, and consequently induces no change in the control pulse appearing on conductor 130. The control pulse appearing on conductor 130 when transistor 95 of threshold circuit 89 is conducting is represented in magnitude by the base line of waveform *h*, and is insufficient to produce, in conjunction with a timing pulse, a change in signal level at an output terminal of coincidence circuit 23, 24, or 25. Summarizing this first step, a first timing pulse initiates the generation of a reference level, current step 133, which is compared to an analog input signal, and a control pulse indicative of the comparison, the base line of waveform *h*, is fed back to indicate to the device producing the reference level that in order to simulate the analog signal the reference level must be increased.

Since the transistor of inverting amplifier 3 is biased to cut off, when timing pulse 132 is applied to input terminal 7, no change in signal level occurs at output terminal 8. However, with the application of timing pulse 132 to delay line 14 a pulse of positive polarity propagates towards short circuit termination 17, and, upon reflection, returns to the input terminals of that delay line with reversed polarity. The reflected pulse is translated by inverting amplifier 3 and appears in inverted form at terminal 11, as timing pulse 134. Delay line 14, for example, has a delay time of 1 μs thereby fixing the interval between timing pulses 132 and 134 at 2 μs. At the start of the second step in the analog-to-digital conversion process, timing pulse 134 is simultaneously applied to input terminal 8 of inverting amplifier 4, delay line 15, first input terminal of coincidence circuit 23, and the ON terminal of bistable multivibrator 32. No change in signal level occurs at the output terminal of coincidence circuit 23 as a result of the application of timing pulse 134 to its first input terminal since, as was previously noted, the magnitude of the signal applied to its second input terminal at this time is, in conjunction with a timing pulse, insufficient to produce a change in signal level at its output terminal. Consequently, both multivibrator 31 and signal generator 63 remain in the ON condition. Multivibrator 32, by the application of pulse 134 to its ON terminal, is rendered in the ON condition, as was multivibrator 31 by the application to its ON terminal of pulse 132.

Signal generator 64, in a similar manner to signal generator 63, is placed in the ON condition in response to multivibrator 32. In being turned ON, signal generator 64 creates a current change through resistor 75 which is illustrated in waveform *d* as current step 135. Since resistor 75 is larger than resistor 74, current step 135 is smaller than current step 133. Current steps 133 and 135, summed at junction 77, comprise second reference level 137, shown in waveform *f*, which is compared to the analog signal in a manner similar to the previous comparison. Since second reference level 137 is of a greater magnitude than the analog signal, current emanating from emitter 84 of transistor 82 decreases by an amount equal to the difference between second reference level 137 and the analog signal. This decrease in current from emitter 84 is accompanied by a decrease in current through resistor 87, and manifests itself as a positive going signal at collector 85. Being more positive than the signal which appears under quiescent conditions, the positive going signal at collector 85 when amplified by amplifier 88 and applied to base 92 induces transistor 91 to be nonconducting. The resulting negative signal at collector 94 is coupled through capacitor 99 to base 96 causing transistor 95 to conduct. If transistors 91 and 95 are fast acting, as suggested, threshold circuit 89 changes state rapidly.

The positive going signal at collector 98, shown in waveform *g* as step 138, is coupled through capacitor 107 and resistor 108 to the variable delay device 80. Variable delay device 80 in response to the positive going characteristic of input signal 138 delays the transmission of that signal for some predetermined time, as depicted by control voltage waveform 139. Control voltage 139, after suitable amplification by amplifier 129, is returned through conductor 130 to second input terminals of coincidence circuits 23, 24 and 25. It is evident that if voltage 138 rather than being delayed, is immediately applied to second input terminal of coincidence circuit 23, as would be a voltage similar to 139′, the coincidence of both control voltage pulse 139′ and timing pulse 134 would be sufficient to produce a positive signal to apply to the OFF terminal of multivibrator 31. In the OFF condition, multivibrator 31 exhibits a digital step on conductor 57 which indicates that first reference signal 133 is larger than the analog input signal. Since in fact, as is shown by waveform *f*, the reverse is true, multivibrator 31 would, in the OFF condition, be residing in an erroneous state of conduction. By addition of variable delay device 80, in accordance with the invention, voltage 138 is prevented from appearing on second input terminal of coincidence circuit 23 in the duration of clock pulse 134. Thus, the presentation of a control pulse which would place multivibrator 31 in an erroneous state of conduction is prevented. Summarizing this second step in the process, a second timing pulse creates a new reference level, current step 137, which is compared to the analog signal, and a control pulse in accordance with the comparison, voltage 139, is delayed and fed back to the device generating the reference level to indicate during the succeeding timing pulse that the reference level should be decreased in order to simulate the analog signal.

Timing pulse 134, after reflection by short circuit termination 18 of delay line 15, is applied with reversed polarity to input terminal 8 of inverting amplifier 4 which produces timing pulse 140 to initiate the third step in the conversion process. Timing pulse 140 is simultaneously applied to input terminal 9 of inverting amplifier 5, delay line 16, first input terminal of coincidence circuit 24, and the ON terminal of bistable multivibrator 33. Due to the coincidence of timing pulse 140 and control pulse 139 on first and second input terminals, respectively, of coincidence circuit 24, a signal, similar in polarity and duration to clock pulse 140, is generated at the output terminal of that coincidence circuit and applied through OR circuit 26 to the OFF terminal of multivibrator 32. Responsively, multivibrator 32 shifts to the OFF condition, thereby applying a signal through conductor 58 tending to render the transistor of signal generator 64 nonconducting. However, as can be seen from current step 135, the transistor of signal generator 64 does not immediately become nonconducting, but rather is delayed in responding for a time interval equal to the storage delay. The application of clock pulse 140 to the ON terminal of multivibrator 33 renders both that device and signal generator 65 in the ON condition, and, as was previously explained, results in a current change shown in waveform *e* as step 141, in resistor 76. Due to the relative weighting of the summing resistors, current step 141 is smaller than both of the previous steps.

Current steps 133, 135, and 141, summed at junction 77, comprise third reference level 142, the magnitude of which, since signal generator 64 is still in the ON condition, is obviously greater than the analog signal. The addition of current step 141 to second reference level 137 further decreases the current through resistor 87, thus driving the voltage at collector 85 further positive. Since transistor 91 of threshold circuit 89 is already nonconducting, a positive going signal applied to its base induces no threshold triggering action, and the signal on conductor 130 remains unchanged. However, before the occurrence of the succeeding timing pulse, 143 of waveform *b*, the transistor of signal generator 64 is rendered nonconducting, thereby diminishing the reference level to a fourth value equal to the sum of current steps 133 and 141, illustrated in waveform *f* as step 144. Fourth reference level 144, being less than the analog input signal, causes an increase in the current from emitter 84 of transistor 82, resulting in a negative going signal at input terminal 90 of threshold circuit 89.

Since the current through resistor 87 in response to both fourth reference level 144 and the analog input signal is greater than the current flowing under quiescent conditions, the voltage at input terminal 90 is more negative than the threshold voltage of the circuit 89 and transistors 91 and 95 rapidly shift their states of conduction. In this respect it may be noted that although, as mentioned in "Pulse and Digital Circuits," the threshold voltages for positive going and negative going signals are theoretically different, this difference is negligible and may be ignored for all practical purposes. The negative going signal at collector 98 of transistor 95 is coupled through capacitor 107 and resistor 108 to the variable delay device 80. Variable delay device 80 in response to signals having a negative going characteristic exhibits substantially no delay, and thus, in accordance with the invention, control pulse 139 is not delayed in returning to its original value. The significance of variable delay device 80 not delaying signals exhibiting a negative going characteristic will be explained in detail subsequently. Summarizing the third step of the process, a third timing pulse creates a still different reference level, current step 142, which is compared to the analog signal, and since this new reference level is still greater than the analog signal, control pulse 139, indicating to the device generating the reference level that less current is needed to simulate the analog signal, is not altered. At the same time, the coincidence of both the third timing pulse and the control pulse applied to the device generating the reference level initiates a decrease in that level which, due to transistor storage delay, does not take place immediately. To initiate the fourth and final step in the conversion process, timing pulse 143 produced in a manner similar to that of the preceding clock pulses is applied directly to first input terminal of coincidence circuit 25. As shown by waveform *d*, before the occurrence of timing pulse 143 the storage delay time of the transistor of signal generator 64 elapses and that signal generator is returned to the OFF condition. Fourth reference signal 144 is thus created comprising the sum of current steps 133 and 141, which is smaller than the analog signal. If variable delay device 80 delayed the transmission of all changes in signal level applied to it, a voltage waveform extended in time, such as 139'', would appear on conductor 130 in response to voltage waveform 138. The coincidence of control signal 139'' and clock pulse 140, would lead to an erroneous condition because it would indicate to the reference level generating device that the fourth reference signal 144 is greater than the analog signal when, in fact, the reverse is true. According to the invention, the return of control pulse 139 to its original value, the base line value, is not delayed. Consequently, during timing pulse 143 the base line value of the control signal is applied to second input terminal of coincidence circuit 25. Thus no change in signal level is transferred through OR circuit 27 to OFF terminal of multivibrator 33, and signal generator 65 is correctly allowed to remain in the ON condition. The effect of not prolonging the return time of control pulse 139 is to allow the timing pulses to occur with greater frequency than otherwise would be permissible for errorless conversion. Summarizing this final step in the conversion process, a fourth timing pulse samples control pulse of waveform *h* to produce an indication as to whether or not the reference level needs to be decreased in order to simulate the analog signal.

As shown in FIG. 1, the digital output steps are detected on conductors 60, 61, and 62. It is readily apparent, however, that a digital output equally representing the amplitude of the analog signal can be detected at any of a number of points on the circuit, for example, at collector 43 of transistor 39 in multivibrator 31 and the corresponding elements of multivibrators 32 and 33. Although the digital output signal of the illustrative embodiment of the invention shown in FIG. 1, comprises three steps or digits, it should be apparent to one skilled in the art that embodiments of the invention may logically be extended to provide either a greater or a lesser number of digits.

For an explanation of the operation of variable delay device 80 attention is now directed to FIG. 3, which shows one illustrative embodiment of such a device. Assume initially that a positive going signal, such as the leading edge of waveform 138, is applied to base 110 of transistor 109. Responsively, the current through the emitter-collector path of that transistor decreases. A positive going signal appears at emitter 111 which is simultaneously applied to base 114 of transistor 113 and, through capacitor 124 and resistor 125, to input terminal 123 of delay network 117. The positive going signal at base 114 results in a positive going signal at emitter 115, thereby rendering diode 118 an open circuit path. The positive going signal at input terminal 123, after being delayed in its translation to output terminal 126 by a time interval equal to the delay time of delay network 117, appears as the leading edge of voltage waveform 139. Any reflection of the delay signal back toward input terminal 123 due to a mismatch at output terminal 126 is absorbed by serially-connected resistor 125 and low impedance emitter-collector path of transistor 109 which in combination substantially equal the characteristic impedance of delay network 117.

Next assume that a negative going signal, such as the trailing edge of waveform 138, is applied to base 110. This signal is translated with unaltered polarity to emitter 115, and in rendering diode 118 a short circuit path is applied substantially instantaneously to output terminal 126 of delay network 117. This is illustrated as the trailing edge of waveform 139. The negative step wave which responsively propagates down delay network 117 from terminal 126 is absorbed without reflection by the termination at input terminal 123. The initial negative going signal is also applied through transistors 109 and 113 to input terminal 123 and when reflected by the mismatch at terminal 126 is returned to input terminal 123 and absorbed by the termination. In translation through resistor 125 and propagation through delay network 117 the negative going signal applied to input terminal 123 is attenuated and thus appears more positive at output terminal 126 than the signal level at emitter 115. If the cathode of diode 118 were connected to emitter 111 insead of emitter 115 the positive impulse caused by the above-mentioned difference in signal levels would be coupled through diode 118 back to the input of delay network 117 and be recirculated until it died out. However, transistor 113 serves as a buffer thus preventing any such undesirable recirculation. While the leading edges of control pulses applied to base 110 should not, for proper operation of the variable delay device of FIG. 3, be spaced closer in time than the delay time of network 117, the inherent delay in the path through the converter from terminal 126 to base 110 is, in all practical situations, great enough to prevent such an occurrence.

While only one illustrative embodiment of the invention has been described herein, it should be apparent to one skilled in the art that numerous other arrangements of components may be devised without departing from the spirit and scope of the invention.

What is claimed is:

1. An analog-to-digital converter comprising input means for an analog signal, means for generating a plurality of reference levels in sequence, output means, means for producing coded control pulses representative of a characteristic of said analog signal relative to a characteristic of said reference levels, means for delaying the transmission of said coded control pulses, and means for varying the delay of said delaying means responsive to particular ones of said coded control pulses.

2. An input signal converter comprising means for generating controllable reference levels, means for generating variable control pulses in response to both said reference signals and said input signal, means for providing a signal transmission path coupling said control pulses to said reference level generating means, and means included in said transmission path for selectively delaying the transmission of particular variations of said control pulses.

3. An input signal converter comprising a plurality of bistable devices each capable of exhibiting two states of conductivity, means for producing distinct reference levels in accordance with distinct combinations of states exhibited by said plurality of bistable devices, means for generating coded control pulses representative of said reference levels relative to said input signal, transmission means for sequentially coupling said control pules to said bistable devices, means included in said transmission means for selectively delaying the transmission of control pulses characterized by a particular code, and output means for sensing the states of each of said bistable devices.

4. An analog-to-digital converter comprising a plurality of multivibrators, signal generating means connected to each of said multivibrators capable of producing electrical signals of distinct magnitudes, summing means connected to each of said signal generating means for producing a reference voltage level, input means for an analog signal, means connected to both said input means and said summing means for producing a control pulse exhibiting one characteristic when said analog signal is greater in magnitude than said reference signal and a control pulse exhibiting another characteristic when said reference signal is greater in magnitude than said analog signal, switching means for sequentially coupling said control pulses to said multivibrators, means for providing a signal transmission path for coupling said control pulses to said switching means, delaying means included in said transmission path for delaying the transmission of said control pulses, sensing means included in said delaying means responsive to said control pulses exhibiting a particular one of said characteristics for varying the delay time of said delaying means and output means connected to each of said multivibrators.

5. An analog-to-digital converter in accordance with claim 4 wherein said means connected to both said input means and said summing means comprise first and second transistors of like conductivity type each having a base electrode, an emitter electrode, and a collector electrode, a first resistor and a capacitor connected in parallel relation coupling the collector electrode of said first transistor to the base electrode of said second transistor, an electrical conductor coupling the emitter electrode of said first transistor to the emitter electrode of said second transistor, and a second resistor coupling the base electrode of said second transistor to a source of reference potential.

6. An analog-to-digital converter in accordance with claim 4 wherein said delaying means includes an artificial delay network having a pair of input terminals and a pair of output terminals, and said sensing means comprises a unidirectional signal translating device connected in circuit between one of said input terminals and a corresponding one of said output terminals.

References Cited in the file of this patent

UNITED STATES PATENTS

| | | |
|---|---|---|
| 2,775,727 | Kernahan et al. | Dec. 25, 1956 |
| 2,784,396 | Kaiser et al. | Mar. 5, 1957 |
| 2,831,113 | Weller | Apr. 15, 1958 |
| 2,848,653 | Hussey | Aug. 19, 1958 |